US012567466B2

(12) United States Patent
Kang et al.

(10) Patent No.: US 12,567,466 B2
(45) Date of Patent: Mar. 3, 2026

(54) NONVOLATILE MEMORY DEVICES AND METHODS OF OPERATING THE NONVOLATILE MEMORY DEVICES

(71) Applicant: Samsung Electronics Co., Ltd., Suwon-si (KR)

(72) Inventors: Philkyu Kang, Suwon-si (KR); Chihyun Kim, Suwon-si (KR); Junehong Park, Suwon-si (KR); Jayang Yoon, Suwon-si (KR); Chiweon Yoon, Suwon-si (KR); Dojeon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 18/468,345

(22) Filed: Sep. 15, 2023

(65) Prior Publication Data

US 2024/0203499 A1     Jun. 20, 2024

(30) Foreign Application Priority Data

Dec. 20, 2022     (KR) ........................ 10-2022-0179743

(51) Int. Cl.
| | |
|---|---|
| *G11C 16/08* | (2006.01) |
| *G11C 16/04* | (2006.01) |
| *G11C 16/24* | (2006.01) |
| *G11C 16/30* | (2006.01) |

(52) U.S. Cl.
CPC .......... *G11C 16/08* (2013.01); *G11C 16/0483* (2013.01); *G11C 16/24* (2013.01); *G11C 16/30* (2013.01)

(58) Field of Classification Search
CPC ......... G11C 16/30; G11C 16/24; G11C 16/08; G11C 16/2483
USPC ...................................................... 365/185.18
See application file for complete search history.

(56) References Cited

U.S. PATENT DOCUMENTS

| | | | | |
|---|---|---|---|---|
| 9,786,372 B2 * | 10/2017 | Nam | ....................... | G11C 16/08 |
| 10,297,299 B2 | 5/2019 | Lee et al. | | |
| 10,984,858 B2 | 4/2021 | Date | | |
| 11,205,482 B2 | 12/2021 | Hioka et al. | | |
| 11,217,314 B2 | 1/2022 | Kwak | | |
| 11,430,502 B2 | 8/2022 | Watanabe et al. | | |
| 11,450,383 B2 | 9/2022 | Date et al. | | |
| 2007/0247957 A1 * | 10/2007 | Miwa | ....................... | G11C 8/08 365/230.06 |

(Continued)

FOREIGN PATENT DOCUMENTS

| | | |
|---|---|---|
| KR | 10-2018-0082830 A | 7/2018 |

*Primary Examiner* — Sung Il Cho
(74) *Attorney, Agent, or Firm* — Harness, Dickey & Pierce, P.L.C.

(57) ABSTRACT

Provided is a method of operating a nonvolatile memory device including a voltage generator, the method including calculating a difference between a voltage level of a first word line node and a voltage level of a second word line node, changing a first reference voltage level of the voltage generator to a second reference voltage level based on the difference between the voltage levels, and determining a target voltage level based on any one of the first reference voltage level and the second reference voltage level. The first word line node may be closer from an output terminal of the voltage generator than the second word line node.

20 Claims, 15 Drawing Sheets

(56)           References Cited

U.S. PATENT DOCUMENTS

2011/0205793 A1\*    8/2011   Huang ................ G11C 11/5642
                                                       365/185.03
2012/0268987 A1\*   10/2012   Hung ................. G11C 16/3418
                                                       365/185.23

\* cited by examiner

BLK

-- PRIOR ART

-- PRIOR ART --

FIG. 9

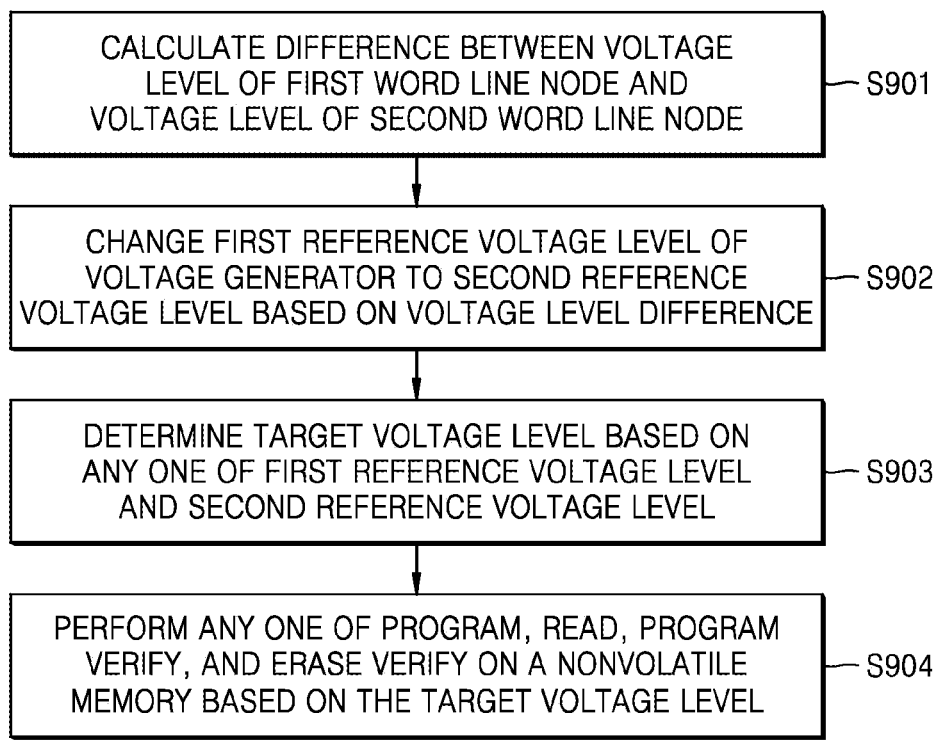

CALCULATE DIFFERENCE BETWEEN VOLTAGE
LEVEL OF FIRST WORD LINE NODE AND
VOLTAGE LEVEL OF SECOND WORD LINE NODE — S901

CHANGE FIRST REFERENCE VOLTAGE LEVEL OF
VOLTAGE GENERATOR TO SECOND REFERENCE
VOLTAGE LEVEL BASED ON VOLTAGE LEVEL DIFFERENCE — S902

DETERMINE TARGET VOLTAGE LEVEL BASED ON
ANY ONE OF FIRST REFERENCE VOLTAGE LEVEL
AND SECOND REFERENCE VOLTAGE LEVEL — S903

PERFORM ANY ONE OF PROGRAM, READ, PROGRAM
VERIFY, AND ERASE VERIFY ON A NONVOLATILE
MEMORY BASED ON THE TARGET VOLTAGE LEVEL — S904

Output Voltage

Node Voltage reduced setup time

NONVOLATILE MEMORY DEVICES AND METHODS OF OPERATING THE NONVOLATILE MEMORY DEVICES

CROSS-REFERENCE TO RELATED APPLICATION

This application claims priority under 35 U.S.C. § 119 to Korean Patent Application No. 10-2022-0179743, filed on Dec. 20, 2022, in the Korean Intellectual Property Office, the disclosure of which is incorporated herein by reference in its entirety.

BACKGROUND

The present inventive concepts relate to memories, and more particularly, to nonvolatile memory devices and methods of operating the nonvolatile memory devices.

Memory devices are used to store data and are classified into volatile memory devices and nonvolatile memory devices. As an example of a nonvolatile memory device, a flash memory device may be used in mobile phones, digital cameras, personal digital assistants (PDAs), mobile computer devices, stationary computer devices, and other devices. Recently, there is a need to reduce the time required for a memory device to store data or read stored data.

SUMMARY

Some example embodiments may provide a nonvolatile memory device capable of improving write and read performance of a memory device by reducing a setup time of a word line and/or a bit line, and an operating method of the nonvolatile memory device.

According to some example embodiments, there is provided a method of operating a nonvolatile memory device including a voltage generator, the method including calculating a difference between a voltage level of a first word line node and a voltage level of a second word line node, changing a first reference voltage level of the voltage generator to a second reference voltage level based on the difference between the voltage levels of the first word line node and the second word line node, and determining a target voltage level based on any one of the first reference voltage level and the second reference voltage level. The first word line node is closer from an output terminal of the voltage generator than the second word line node.

According to some example embodiments, there is provided a method of operating a nonvolatile memory device including a voltage generator, the method including calculating a difference between a voltage level of a first bit line node and a voltage level of a second bit line node, changing a first reference voltage level of the voltage generator to a second reference voltage level based on the difference between the voltage levels of the first bit line node and the second bit line node, and determining a target voltage level based on any one of the first reference voltage level and the second reference voltage level. The first bit line node may be closer from an output terminal of the voltage generator than the second bit line node.

According to some example embodiments, there is provided a nonvolatile memory device including a switch, a voltage subtractor and a voltage adder, the nonvolatile memory device including a memory cell array including memory cells and select word lines coupled to the memory cells, a control logic configured to control the voltage subtractor to calculate a difference between a voltage level of a first word line node and a voltage level of a second word line node, control the voltage adder to change a first reference voltage level to a second reference voltage level based on the difference between the voltage levels of the first word line node and the second word line node, and control the switch to determine a target voltage level based on any one of the first reference voltage level and the second reference voltage level, and a voltage generator configured to generate the target voltage level. The first word line node and the second word line node are nodes on the selected word line, and the first word line node may be closer from an output terminal of the voltage generator than the second word line node.

BRIEF DESCRIPTION OF THE DRAWINGS

Example embodiments will be more clearly understood from the following detailed description taken in conjunction with the accompanying drawings in which:

FIG. 9 illustrates an operating procedure of a nonvolatile memory device according to some example embodiments;

DETAILED DESCRIPTION

Figure 1:
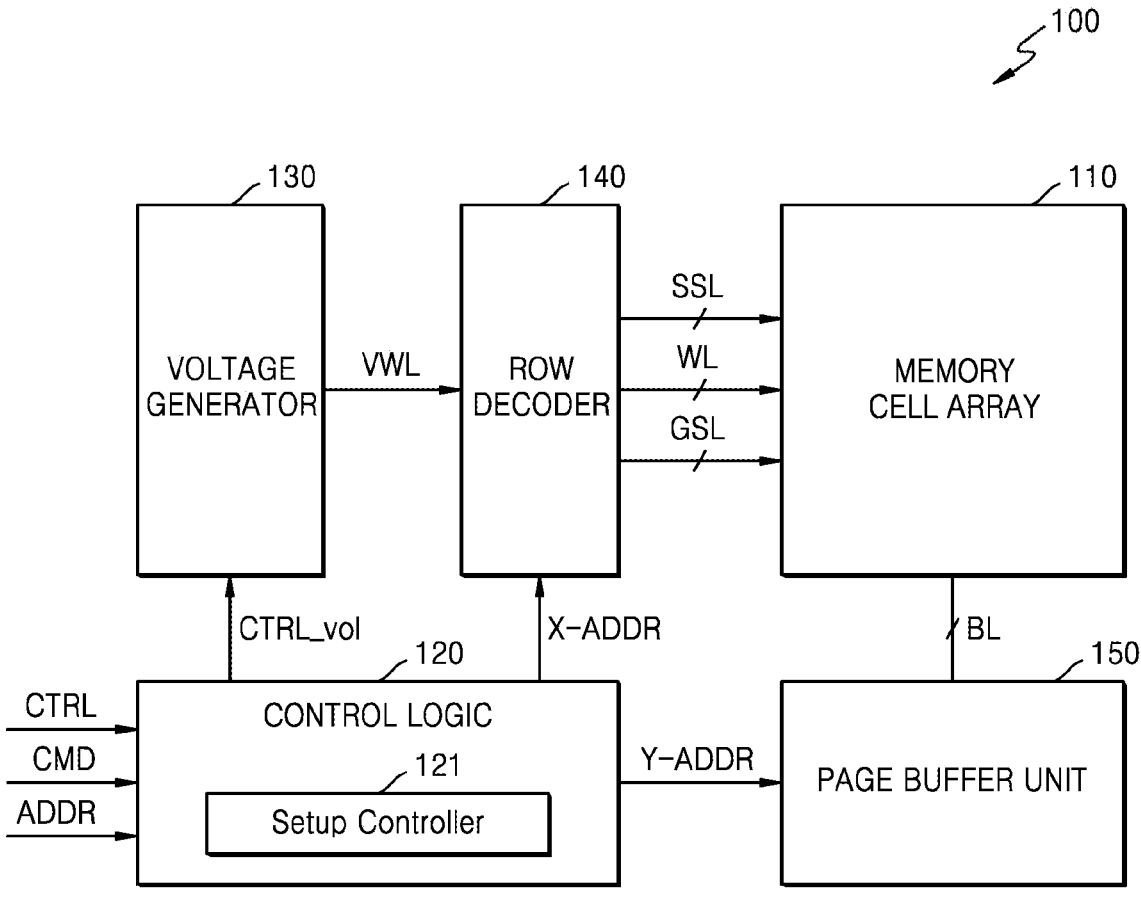
FIG. 1 is a block diagram illustrating a nonvolatile memory device according to some example embodiments.

The present inventive concepts will be described more fully hereinafter with reference to the accompanying drawings, in which some example embodiments of the inventive concepts are shown. As those skilled in the art would realize, the described example embodiments may be modified in various different ways, all without departing from the spirit or scope of the present inventive concepts.

Accordingly, the drawings and description are to be regarded as illustrative in nature and not restrictive. Like reference numerals designate like elements throughout the specification. The sequence of operations or steps are not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

FIG. 1 is a block diagram illustrating a nonvolatile memory device according to some example embodiments.

Referring to FIG. 1, in some example embodiments, a nonvolatile memory device 100 may include a memory cell array 110, a control logic 120, a voltage generator 130, a row decoder 140, and a page buffer unit 150, but example embodiments are not limited thereto. Although not shown in FIG. 1, in some example embodiments, the nonvolatile memory device 100 may further include a data input/output circuit or an input/output interface, but example embodiments are not limited thereto. In addition, in some example embodiments, the nonvolatile memory device 100 may further include a column logic, a pre-decoder, a temperature sensor, a command decoder, an address decoder, and the like, but example embodiments are not limited thereto.

The memory cell array 110 may be connected to the page buffer unit 150 through bit lines BL, and may be connected to the row decoder 140 through word lines WL, string select lines SSL, and ground select lines GSL. The memory cell array 110 may include a plurality of memory cells, and for example, the memory cells may be flash memory cells. Hereinafter, some example embodiments will be described in detail taking a case in which the plurality of memory cells are NAND flash memory cells as an example. However, example embodiments are not limited thereto, and in some example embodiments, the plurality of memory cells may be resistive memory cells, such as resistive RAM (ReRAM), phase change RAM (PRAM), or magnetic RAM (MRAM).

The memory cell array 110 of the nonvolatile memory device 100 may include a plurality of word lines (e.g., WL) and a plurality of bit lines (e.g., BL). Also, the nonvolatile memory device 100 may include a voltage generator (e.g., 130) for applying (e.g., configured to apply) voltages to a plurality of word lines (e.g., WL) and a plurality of bit lines (e.g., BL). When the voltage generator (e.g., 130) applies a voltage to a word line (e.g., WL) or bit line (e.g., BL), parasitic resistance and/or a parasitic capacitor may be generated due to lines (e.g., word lines WL and/or bit lines BL) close to the line (e.g., word line WL and/or bit line BL) to which the voltage is applied. Due to the presence of such parasitic resistance and/or parasitic capacitor, the voltage may vary depending on the distance from the voltage generator (e.g., 130) on the same word line (e.g., WL) or bit line (e.g., BL). Due to this voltage difference, a setup time may be increased in an operation, such as a program. Accordingly, there is a demand for a method of reducing setup time in consideration of this phenomenon.

The control logic 120 according to some example embodiments may include a setup controller 121. The setup controller 121 may be configured to control a voltage subtractor (not shown) to calculate a difference between, for example, a voltage of a first word line node and a voltage of a second word line node. The first word line node may be closer to the output terminal of the voltage generator 130 than the second word line node.

The setup controller 121 may be configured to control a voltage adder (not shown) to change the first reference voltage level of the voltage generator 130 to the second reference voltage level based on the voltage level difference.

For example, in some example embodiments, the setup controller 121 may be configured to control a voltage subtractor (not shown) or a voltage adder (not shown) to generate a reference compensation level based on a voltage level difference. Also, in some example embodiments, the setup controller 121 may be configured to control a voltage adder (not shown) to generate the second reference voltage level by adding the first reference voltage level and the reference compensation level.

As another example, in some example embodiments, the setup controller 121 may be configured to control a voltage subtractor (not shown) and/or an analog to digital converter (ADC) to generate a reference compensation level based on a voltage level difference, and the ADC (not shown) may be controlled to convert the reference compensation level into a first digital code. The setup controller 121 may be configured to generate a second digital code by adding the first digital code and the reference voltage level with a voltage adder (not shown). The setup controller 121 may be configured to determine a voltage level indicated by the second digital code as the second reference voltage level. The setup controller 121 may be configured to determine the duration of the target voltage level based on the first digital code, and may apply the target voltage level for the determined duration.

The setup controller 121 may be configured to determine a target voltage level based on any one of the first reference voltage level and the second reference voltage level.

In some example embodiments, the setup controller 121 may be configured to determine the target voltage level based on the second reference voltage level when a difference between the first reference voltage level and the second reference voltage level is greater than or equal to a threshold value.

In some example embodiments, when a difference between the first reference voltage level and the second reference voltage level is less than a threshold value, the setup controller 121 may be configured to determine the target voltage level based on the first reference voltage level.

In some example embodiments, the setup controller 121 may be configured to control the voltage generator 130 to output the target voltage level. In addition, the setup controller 121 may be configured to perform any one of program, read, program verify, and erase verify on the memory cell array 110 based on the target voltage level, but example embodiments are not limited thereto. The setup controller 121 may be configured to control the output voltage of the voltage generator 130 in consideration of the voltage difference between the first node and the second node, so that the operation performance of program, read, program verify, and erase verify may be improved. For example, a setup time related to the above operations may be reduced.

In some example embodiments, the memory cell array 110 may include a 3-dimensional (3D) memory cell array, and the 3D memory cell array may include a plurality of NAND strings, and each NAND string may include memory cells connected to word lines vertically stacked on a substrate, which will be described in detail with reference to FIGS. 2 to 4. However, example embodiments are not limited thereto, and in some example embodiments, the memory cell array 110 may include a two-dimensional (2D) memory cell array, and the 2D memory cell array may include a plurality of NAND strings arranged along row and column directions.

Figure 2:
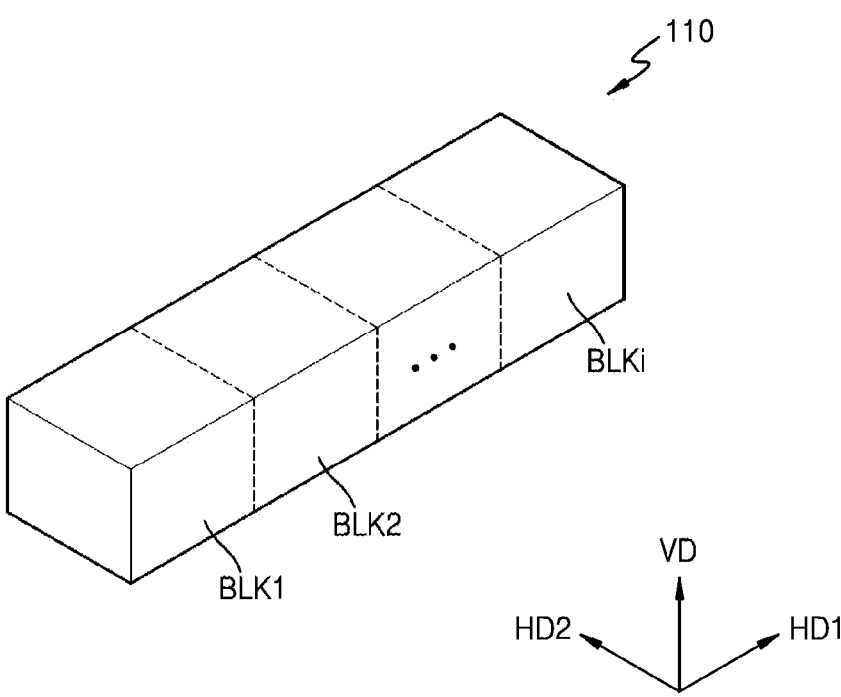
FIG. 2 illustrates a memory cell array according to some example embodiments.

FIG. 2 illustrates a memory cell array according to some example embodiments.

Referring to FIG. 2, in some example embodiments, the memory cell array 110 may include a plurality of memory blocks BLK1 to BLKi, and i may be a positive integer. Each of the plurality of memory blocks BLK1 to BLKi may have a 3D structure (or a vertical structure). For example, each of the plurality of memory blocks BLK1 to BLKi may include a plurality of NAND strings extending along the vertical direction VD. In some example embodiments, the plurality of NAND strings may be provided to be spaced apart by a certain distance or alternatively, a desired distance, along the first and second horizontal directions HD1 and HD2. The plurality of memory blocks BLK1 to BLKi may be selected by the row decoder 140. For example, the row decoder 140 may be configured to select a memory block corresponding to a block address from among the memory blocks BLK1 to BLKi.

Figure 3:
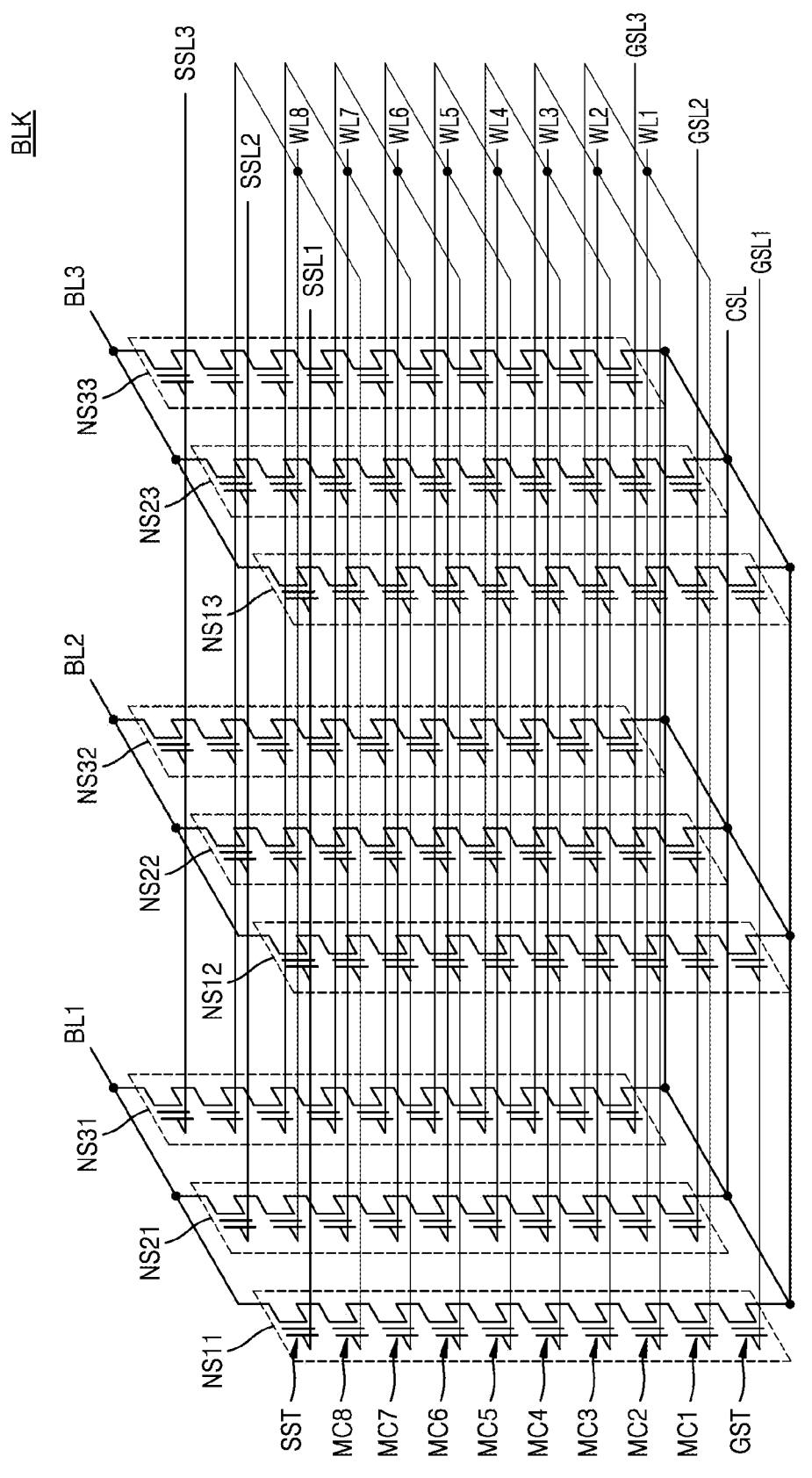
FIG. 3 is a circuit diagram illustrating an equivalent circuit of a memory block according to some example embodiments.

FIG. 3 is a circuit diagram illustrating an equivalent or substantially equivalent circuit of a memory block BLK according to some example embodiments. For example, the memory block BLK may correspond to one or more of the plurality of memory blocks BLK1 to BLKi of FIG. 2.

Referring to FIG. 3, in some example embodiments, the memory block BLK may include a plurality of NAND strings NS11 to NS33, a plurality of word lines WL1 to WL8, a plurality of bit lines BL1 to BL3, a plurality of ground select lines GSL1 to GSL3, a plurality of string select lines SSL1 to SSL3, and a common source line CSL, but example embodiments are not limited thereto. Here, the number of NAND strings (e.g., NS11 to NS33), the number of word lines (e.g., the number of word lines of the plurality of word lines W1 to WL8), the number of bit lines (e.g., the number of bit lines of the plurality of bit lines BL1 to Bl3), the number of ground select lines (e.g., the number of ground select lines of the plurality of ground select lines GSL1 to GSL3), and the number of string select lines (e.g., the number of string select lines of the plurality of string select lines SSL1 to SSL3) may be variously changed according to some example embodiments.

In some example embodiments, NAND strings NS11, NS21, and NS31 may be provided between the first bit line BL1 and the common source line CSL, NAND strings NS12, NS22, and NS32 may be provided between the second bit line BL2 and the common source line CSL, and NAND strings NS13, NS23, and NS33 may be provided between the third bit line BL3 and the common source line CSL, but example embodiments are not limited thereto. Each NAND string (e.g., NS11, NS21, NS31, NS12, NS22, NS32, NS13, NS23, and/or NS33) may include a string select transistor SST, a plurality of memory cells MC1 to MC8, and a ground select transistor GST connected in series, but example embodiments are not limited thereto.

In some example embodiments the string select transistor SST is connected to corresponding string select lines SSL1 to SSL3. The plurality of memory cells MC1 to MC8 are respectively connected to corresponding word lines WL1 to WL8. The ground select transistor GST is connected to corresponding ground select lines GSL1 to GSL3. The string select transistor SST is connected to corresponding bit lines BL1 to BL3, and the ground select transistor GST is connected to the common source line CSL. However, example embodiments are not limited thereto.

In some example embodiments, word lines (e.g., WL1 to WL8) of the same height are commonly connected to each other, the string select lines SSL1 to SSL3 are separated from each other, and the ground select lines GSL1 to GSL3 are also separated from each other, but example embodiments are not limited thereto. Although FIG. 3 illustrates that the three string select lines SSL1 to SSL3 share a word line of the same height, example embodiments are not limited thereto. For example, two string select lines (e.g., two, two or more, or at least two string select lines of the plurality of string select lines SSL1 to SSL3) may share a word line (e.g., one or at least one word line of the plurality of word lines WL1 to WL8) of the same height. For example, four string select lines may share a word line of the same height, but example embodiments are not limited thereto.

Figure 4:
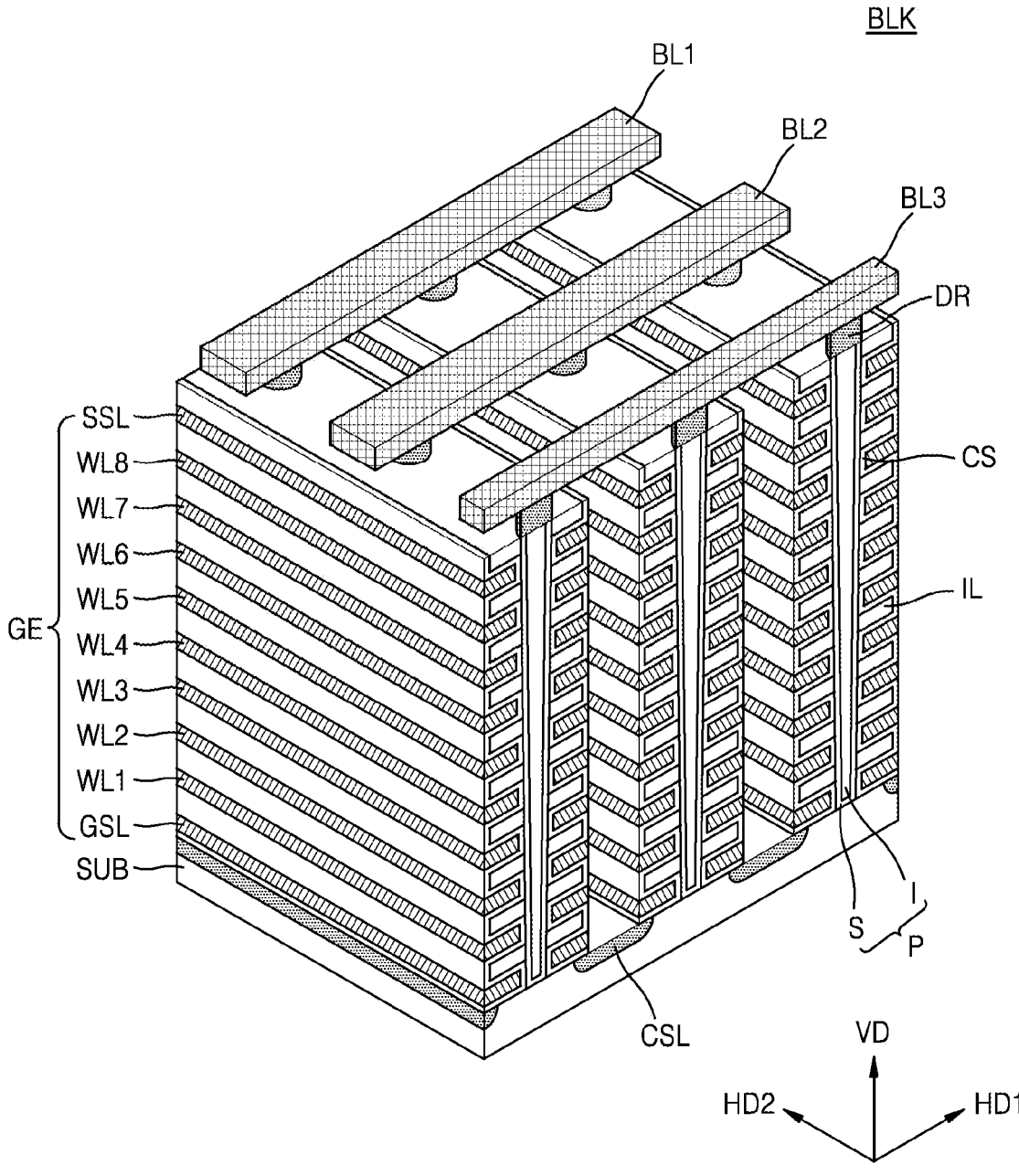
FIG. 4 is a perspective view illustrating the memory block of FIG. 3 according to some example embodiments.

FIG. 4 is a perspective view illustrating the memory block BLK of FIG. 3 according to some example embodiments.

Referring to FIG. 4, in some example embodiments, the memory block BLK is formed, or may be formed, in a direction perpendicular to the substrate SUB. The substrate SUB may have a first conductivity type (e.g., p-type) and may extend along, or alternatively in, the second horizontal direction HD2 on the substrate SUB, and a common source line CSL doped with impurities of a second conductivity type (e.g., n-type) is provided. In some example embodiments, on a region of the substrate SUB between two adjacent common source lines CSL (e.g., two adjacent common source lines CSL of a plurality of common source lines CSL), a plurality of insulating films IL extending along the second horizontal direction HD2 are sequentially provided along the vertical direction VD, and the plurality of insulating films IL are spaced apart from each other by a particular, or alternatively desired, distance in the vertical direction VD. In some example embodiments, the plurality of insulating films IL may include an insulating material, such as silicon oxide, but example embodiments are not limited thereto.

In some example embodiments, on the region of the substrate SUB between two adjacent common source lines CSL (e.g., two adjacent common source lines CSL of a plurality of common source lines CSL), a plurality of pillars P sequentially disposed along the first horizontal direction HD1 and penetrating the plurality of insulating films IL along the vertical direction VD are provided. In some example embodiments, the plurality of pillars P may penetrate the plurality of insulating films IL to contact the substrate SUB. In some example embodiments, a surface layer S of each pillar P of the plurality of pillars P may include the first type of silicon material and function as a channel region (e.g., the surface layer S of each pillar P of the plurality of pillars P may include the first type of silicon material and may be configured to function as a channel region). In some example embodiments, the inner layer I of each pillar P of the plurality of pillars P may include an insulating material, such as silicon oxide or an air gap, but example embodiments are not limited thereto.

In some example embodiments, in a region between two adjacent common source lines CSL (e.g., two adjacent common source lines CSL of the plurality of common source lines CSL), a charge storage layer CS is provided along exposed surfaces of the insulating films IL of the plurality of insulating films IL, the pillars P of the plurality of pillars P, and the substrate SUB. The charge storage layer CS may include a gate insulating layer (also referred to as a 'tunneling insulating layer'), a charge trap layer, and a blocking insulating layer, but example embodiments are not limited thereto. In some example embodiments, the charge storage layer CS may have an oxide-nitride-oxide (ONO) structure. Also, in some example embodiments, in a region between two adjacent common source lines CSL (e.g., two adjacent common source lines CSL of the plurality of common source lines CSL), gate electrodes GE, such as select lines GSL and SSL and word lines WL1 to WL8 are provided on the exposed surface of the charge storage layer CS.

In some example embodiments, drains or drain contacts DR are provided on the plurality of pillars P, respectively. For example, the drains or the drain contacts DR may include a silicon material doped with impurities having the second conductivity type. Bit lines BL1 to BL3 extending in the first horizontal direction HD1 and spaced apart from each other by a particular, or alternatively desired, distance along the second horizontal direction HD2 are provided on the drains DR.

In some example embodiments, as illustrated in FIGS. 2 to 4, for example, when the memory cell array 110 is a 3D memory cell array, the degree of integration of the nonvolatile memory device 100 may be improved by increasing the number of word lines WL1 to WL8 vertically stacked on the substrate SUB. For example, as the number of word lines WL1 to WL8 vertically stacked on the substrate SUB increases, the spacing between the word lines WL1 to WL8 is reduced, and as a result, the capacitance of the plate-shaped word lines WL1 to WL8 increases. Since the loading time of the word lines WL1 to WL8 corresponds to the product of resistance and capacitance, as the capacitance increases, the loading time of the word lines WL1 to WL8 may increase.

The increase in the loading time of the word lines WL1 to WL8 may increase the time of a program operation, a read operation, a program verify operation, or an erase verify operation of the nonvolatile memory device 100, but example embodiments are not limited thereto. Accordingly, performance of the nonvolatile memory device 100 may decrease. Therefore, to improve both the degree of integration and performance of the nonvolatile memory device 100, there is a need for a method of reducing the loading time of the word lines WL1 to WL8 while increasing the number of the word lines WL1 to WL8 vertically stacked on the substrate SUB.

In addition, in some example embodiments the control logic 120 may be configured to output various control signals (e.g., as illustrated in FIG. 1), for example, the voltage control signal CTRL_vol, the row address X-ADDR, and the column address Y-ADDR, for programming data into the memory cell array 110, reading data from the memory cell array 110, or erasing data stored in the memory cell array 110 based on the command CMD, the address ADDR, and the control signal CTRL, but example embodiments are not limited thereto. Thus, the control logic 120 may be configured to control various operations within the nonvolatile memory device 100 as a whole.

In some example embodiments, the voltage generator 130 may be configured to generate various types of voltages to perform program, read, and erase operations on the memory cell array 110 based on the voltage control signal CTRL_vol. In some example embodiments, the voltage generator 130 may be configured to generate a word line voltage VWL, for example, a program voltage, a read voltage, a pass voltage, an erase verify voltage, or a program verify voltage, but example embodiments are not limited thereto. Also, in some example embodiments, the voltage generator 130 may further be configured to generate a string select line voltage and a ground select line voltage based on the voltage control signal CTRL_vol.

In some example embodiments, the row decoder 140 may be configured to select one of a plurality of memory blocks (e.g., BLK1, BLK2, . . . , BLKi), select one of the word lines WL (e.g., WL1 to WL8) of the selected memory block (e.g., BLK1, BLK2, . . . , BLKi), and select one of a plurality of string select lines SSL in response to the row address X-ADDR. The page buffer unit 150 may be configured to select some of the bit lines BL of the plurality of bit lines (e.g., BL1 to BL3) in response to the column address Y-ADDR. In some example embodiments, the page buffer unit 150 may be configured to operate as a write driver or sense amplifier according to an operation mode, but example embodiments are not limited thereto.

Figure 5:
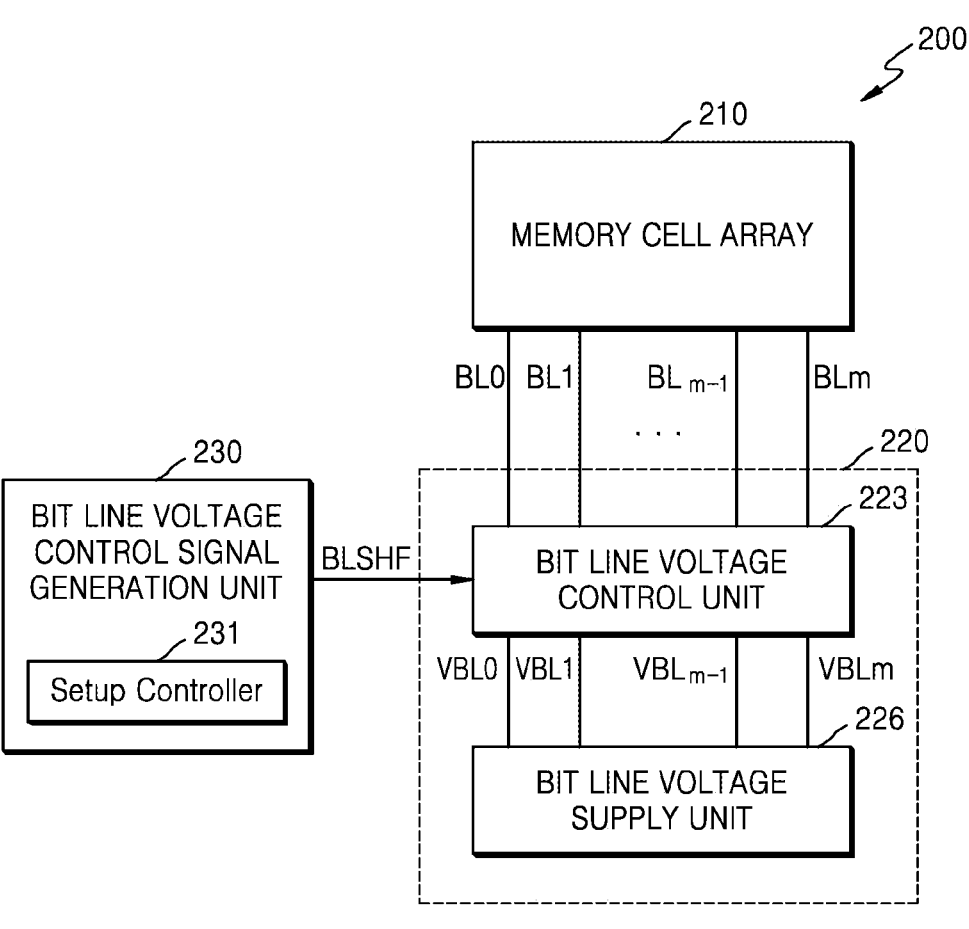
FIG. 5 illustrates a nonvolatile memory device according to some example embodiments.

FIG. 5 illustrates a nonvolatile memory device according to some example embodiments.

A description of the nonvolatile memory device 200 of FIG. 5 overlapping with that of the nonvolatile memory device 100 of FIG. 1 may be omitted. Referring to FIG. 5, in some example embodiments, the nonvolatile memory device 200 may include a memory cell array 210, a page buffer unit 220, and a bit line voltage control signal generation unit 230, but example embodiments are not limited thereto. For example, the memory cell array 210 may be the memory cell array 110 of FIG. 1. For example, the page buffer unit 220 may be the page buffer unit 150 of FIG. 1.

The page buffer unit 220 may be connected to the memory cell array 210 through a plurality of bit lines BL0, BL1, BLm−1, and BLm. The page buffer unit 220 may be configured to control voltage levels of the plurality of bit lines BL0, BL1, BLm−1, and BLm in response to the bit line voltage control signal BLSHF input from the bit line voltage control signal generation unit 230. Although not shown in FIG. 5, the page buffer unit 220 may include a latch unit (not shown) and a data input/output unit (not shown) to read data from a memory cell array (e.g., memory cell array 210) or write data to the memory cell array (e.g., memory cell array 210).

Referring to FIG. 5, in some example embodiments, the page buffer unit 220 may include a bit line voltage control unit 223 and a bit line voltage supply unit 226. The bit line voltage control unit 223 may be configured to control voltage levels of the plurality of bit lines BL0, BL1, BLm−1, and BLm in response to a bit line voltage control signal BLSHF received from the bit line voltage control signal generation unit 230 and the plurality of bit line supply voltages VBL0, VBL1, VBLm−1, and VBLm input from the bit line voltage supply unit 226. In some example embodiments, the bit line voltage supply unit 226 may be configured to output a plurality of bit line supply voltages VBL0, VBL1, VBLm−1, and VBLm corresponding to the plurality of bit lines BL0, BL1, BLm−1, and BLm, respectively, to the bit line voltage control unit 223.

The bit line voltage control signal generation unit 230 according to some example embodiments may include a setup controller 231 (e.g., setup controller 121 illustrated in FIG. 1). The setup controller 231 may be configured to control a voltage subtractor (not shown) to calculate a difference between the voltage of a first bit line node and the voltage of a second bit line node. The first bit line node may be closer to the output terminal of the bit line voltage supply unit 226 than the second bit line node.

In some example embodiments, the setup controller 231 may be configured to control a voltage adder (not shown) to change a first reference voltage level of a bit line voltage supply unit 226 to a second reference voltage level based on the voltage level difference.

In some example embodiments, the setup controller 231 may be configured to control a voltage subtractor (not shown) or a voltage adder (not shown) to generate a reference compensation level based on a voltage level difference. Also, in some example embodiments, the setup controller 231 may be configured to control a voltage adder (not shown) to generate the second reference voltage level by adding the first reference voltage level and the reference compensation level.

As another example, in some example embodiments, the setup controller 231 controls, and/or may be configured to control, a voltage subtractor (not shown) or an analog to digital converter (ADC) to generate a reference compensation level based on a voltage level difference, and the ADC (not shown) may be controlled and/or configured to convert the reference compensation level into a first digital code. In some example embodiments the setup controller 231 may be configured to generate a second digital code by adding the first digital code and the reference voltage level with a voltage adder (not shown). The setup controller 231 may be configured to determine a voltage level indicated by the second digital code as the second reference voltage level. The setup controller 231 may be configured to determine the duration of the target voltage level based on the first digital code, and may be configured to apply the target voltage level for the determined duration.

In some example embodiments, the setup controller 231 may be configured to determine a target voltage level based on any one of the first reference voltage level and the second reference voltage level, but example embodiments are not limited thereto.

In some example embodiments, the setup controller 231 may be configured to determine the target voltage level based on the second reference voltage level when a difference between the first reference voltage level and the second reference voltage level is greater than or equal to a threshold value.

In some example embodiments, when a difference between the first reference voltage level and the second reference voltage level is less than a threshold value, the setup controller 231 may be configured to determine the target voltage level based on the first reference voltage level.

In some example embodiments the setup controller 231 may be configured to control the bit line voltage supply unit 226 to output the target voltage level. In addition, in some example embodiments, the setup controller 231 may be configured to perform any one of program, read, program verify, and erase verify on the memory cell array 210 based on the target voltage level. In some example embodiments, the setup controller 231 may be configured to control the output voltage of the bit line voltage supply unit 226 in consideration of the voltage difference between the first node and the second node, so that the operation performance of program, read, program verify, and erase verify may be improved. In some example embodiments, a setup time related to the above operations may be reduced.

Figure 6:
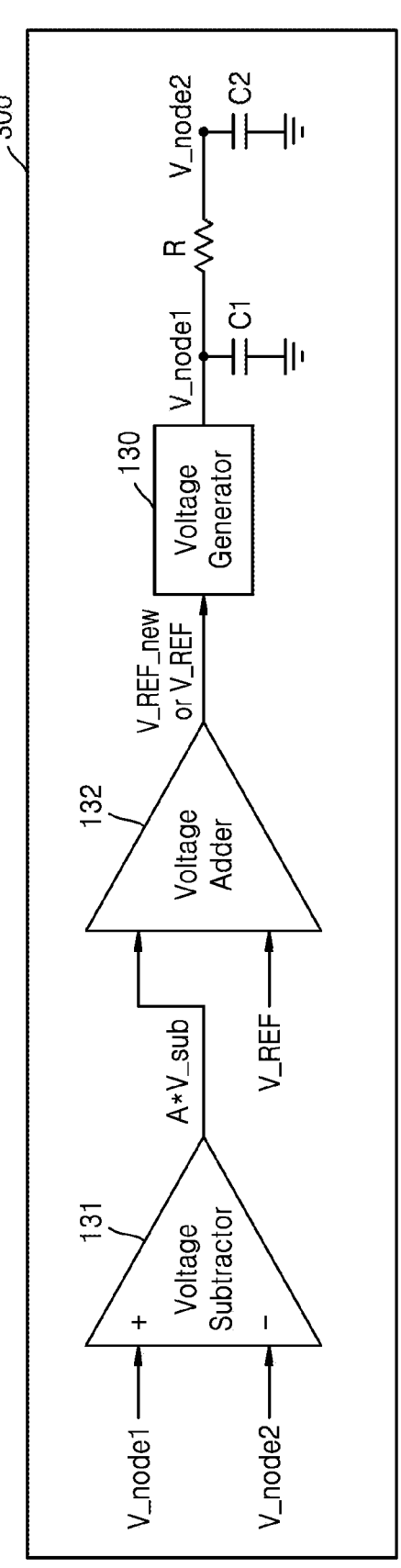
FIG. 6 illustrates some configurations of a nonvolatile memory device according to some example embodiments.

FIG. 6 illustrates some configurations of a nonvolatile memory device according to some example embodiments. FIG. 6 may be described with reference to FIG. 1.

Referring to FIG. 6, in some example embodiments, the nonvolatile memory device 300 may include a voltage subtractor 131, a voltage adder 132, and a voltage generator 130. For convenience of description, only the voltage subtractor 131, the voltage adder 132, and the voltage generator 130 are shown in FIG. 6, but the nonvolatile memory device 300 may further include a memory cell array (not shown), a page buffer unit (not shown), a control logic (not shown), and a row decoder (not shown) and is not limited to the above configurations. For example, the nonvolatile memory device 300 may correspond to the nonvolatile memory device 100 of FIG. 1 including the memory cell array 110, the page buffer unit 150, the control logic 120, and the row decoder 140 of FIG. 1, and redundant descriptions may be omitted. In some example embodiments, the voltage subtractor 131 and the voltage adder 132 may be included in the voltage generator 130 or located outside the voltage generator 130, but example embodiments are not limited thereto.

Referring to FIG. 6, in some example embodiments, a resistor R exists between a first node and a second node, and a capacitor C1 is connected to the first node and a capacitor C2 is connected to the second node, respectively. When the first node and the second node are nodes on a word line (WL), the resistor R, the capacitor C1, and the capacitor C2 may be parasitic resistances and capacitors generated by other word lines adjacent to the word line. A parasitic resistance and a parasitic capacitor may exist between the first node and the second node on the word line or bit line in various forms but are not limited to the form shown in FIG. 6. The parasitic resistance and the parasitic capacitor may generate a difference between the voltage V_node1 of the first node and the voltage V_node2 of the second node.

In some example embodiments, the voltage subtractor 131 may be configured to determine the difference between the voltage V_node1 of the first node and the voltage V_node2 of the second node. For example, the first node may be an output terminal of the voltage subtractor 131, and the second node may be a node on a word line connected to the output terminal of the voltage generator 130. In some example embodiments, the first node may be a node on a word line connected to the output terminal of the voltage generator 130, and the second node may be a node on the word line connected to the output terminal of the voltage generator 130, and a distance from the first node and the output terminal of the voltage generator 130 may be different. For example, the voltage subtractor 131 may be configured to detect a voltage difference between two nodes on the word line from the output terminal of the voltage generator 130.

In some example embodiments, the first node may be an output terminal of the voltage subtractor 131 and the second node may be a node on a bit line connected to the output terminal of the voltage generator 130. In some example embodiments, the first node may be a node on a bit line connected to the output terminal of the voltage generator 130, and the second node may be a node on the bit line connected to the output terminal of the voltage generator 130, and a distance from the first node and the output terminal of the voltage generator 130 may be different. For example, the voltage subtractor 131 may be configured to detect a voltage difference between two nodes on the bit line from the output terminal of the voltage generator 130.

In some example embodiments, the voltage subtractor 131 may be configured to output a voltage level V_sub corresponding to a difference between the voltage V_node1 of the first node and the voltage V_node2 of the second node. For example, the voltage level $A*V\_sub$ obtained by multiplying the gain A by the voltage level V_sub corresponding to the difference between the voltage V_node1 of the first node and the voltage V_node2 of the second node may be output.

In some example embodiments, the voltage generator 130 may be configured to generate a voltage based on a reference voltage V_REF. For example, the voltage generator 130 may be configured to apply an output voltage by adding another voltage level to the level of the reference voltage V_REF. In some example embodiments, the voltage generator 130 may be configured to apply an output voltage by multiplying the level of the reference voltage V_REF by another voltage level. The voltage generator 130 may be configured to generate the output voltage in various ways using the reference voltage V_REF, and is not limited to the above-described example embodiments.

In some example embodiments the voltage adder 132 may be configured to receive the reference voltage V_REF of the voltage generator 130 and the output voltage level A*V_sub of the voltage subtractor 131 as inputs. For example, the voltage adder 132 may be configured to receive the reference voltage level V_REF of the voltage generator 130 and a voltage level corresponding to a difference between the voltage level of the first word line node (e.g., V_node1) and the voltage level of the second word line node (e.g., V_node2).

In some example embodiments the voltage adder 132 may be configured to output a voltage level V_add (e.g., V_REF_new) obtained by adding the reference voltage level V_REF of the voltage generator 130 and the output voltage level A*V_sub of the voltage subtractor 131. For example, the voltage adder 132 may be configured to convert the output voltage level A*V_sub to correspond to the reference voltage level V_REF, and add the converted output voltage level A*V_sub to the reference voltage level V_REF. The voltage level V_add may be referred to as a new reference voltage level V_REF_new. The voltage adder 132 may be configured to input the voltage level V_REF_new to the voltage generator 130 as a new reference voltage. For example, the voltage adder 132 may be configured to change the reference voltage level V_REF to a new reference voltage level V_REF_new based on the difference between the voltage V_node1 of the first node and the voltage V_node2 of the second node.

In some example embodiments, the voltage adder 132 may be configured to select one of the new reference voltage level V_REF_new and the reference voltage level V_REF. For example, the voltage adder 132 may be configured to select and output the reference voltage level V_REF when the output voltage level A*V_sub of the voltage subtractor 131 is smaller than the threshold voltage. As another example, in some example embodiments, the voltage adder 132 may be configured to output a new reference voltage level V_REF_new when the output voltage level A*V_sub of the voltage subtractor 131 is greater than the threshold voltage. For example, the voltage adder 132 may be configured to change the reference voltage level when a difference between the voltage V_node1 of the first node and the voltage V_node2 of the second node is significantly large.

In some example embodiments, the voltage generator 130 may be configured to receive any one of the new reference voltage level V_REF_new and the reference voltage level V_REF from the voltage adder 132. When the voltage generator 130 receives a new reference voltage level V_REF_new, the voltage generator 130 may be configured to generate an output voltage using the new reference voltage level V_REF_new. Accordingly, when the nonvolatile memory device 300 performs any one of program, read, program verify, and erase verify on the nonvolatile memory (not shown) based on the difference between the voltage of the first node V_node1 and the voltage of the second node V_node2, set-up time may be reduced.

Figure 7:
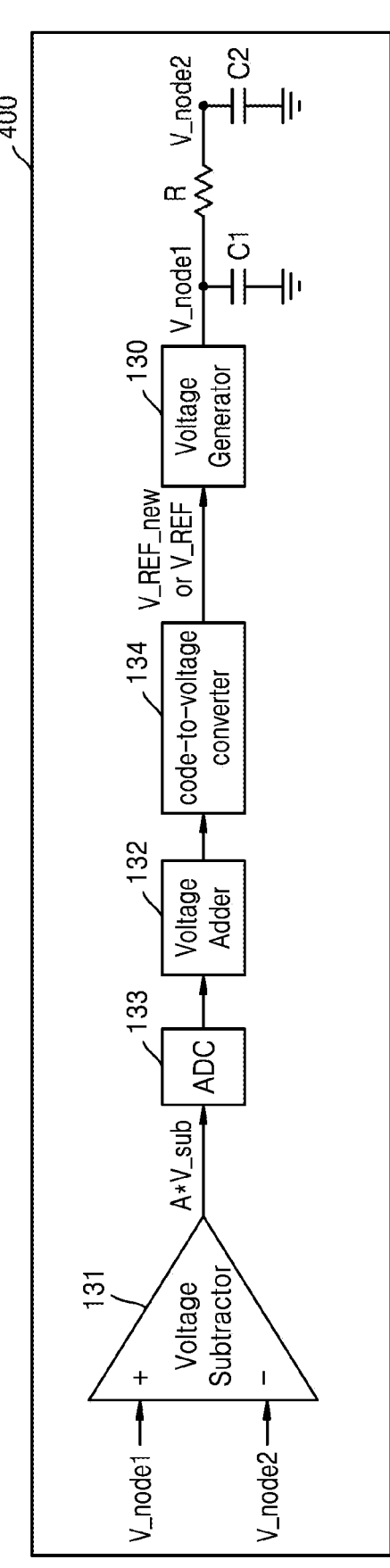
FIG. 7 illustrates some configurations of a nonvolatile memory device according to some example embodiments.

FIG. 7 illustrates some configurations of a nonvolatile memory device according to some example embodiments. FIG. 7 may be described with reference to FIGS. 1 and 6.

Referring to FIG. 7, in some example embodiments, a nonvolatile memory device 400 may include a voltage subtractor 131, a voltage adder 132, an analog to digital converter (ADC) 133, a code-to-voltage converter 134, and a voltage generator 130, but example embodiments are not limited thereto. For convenience of description, only the voltage subtractor 131, the voltage adder 132, the ADC 133, the code-to-voltage converter 134, and the voltage generator 130 are shown in FIG. 7, but the nonvolatile memory device 300 may further include a memory cell array (not shown), a page buffer unit (not shown), a control logic (not shown), and a row decoder (not shown) and is not limited to the above configurations. For example, the nonvolatile memory device 300 may correspond to the nonvolatile memory device 100 of FIG. 1, and duplicate descriptions of FIGS. 1 and 6 may be omitted.

In some example embodiments, the voltage subtractor 131 may be configured to determine the difference between the voltage V_node1 of the first node and the voltage V_node2 of the second node. The voltage subtractor 131 may be configured to output a voltage level Vsub corresponding to a difference between the voltage V_node1 of the first node and the voltage V_node2 of the second node. For example, the voltage level A*V_sub obtained by multiplying the gain A by the voltage level V_sub corresponding to the difference between the voltage V_node1 of the first node and the voltage V_node2 of the second node may be output. The voltage subtractor 131 may be configured to input the output voltage level A*V_sub to the ADC 133.

In some example embodiments, the ADC 133 may be configured to generate a first digital code indicating the voltage level A*V_sub received from the voltage subtractor 131. The ADC 133 may be configured to transfer the first digital code to the voltage adder 132.

In some example embodiments, the voltage adder 132 may be configured to receive the reference voltage V_REF of the voltage generator 130 and the first digital code. The reference voltage V_REF may be in the form of a digital code. The voltage adder 132 may be configured to generate a second digital code by adding the reference voltage V_REF and the first digital code based on a bit operation. For example, the voltage adder 132 may be configured to convert the first digital code indicating the output voltage level A*V_sub to correspond to the reference voltage level V_REF, and generate a second digital code by adding the converted first digital code corresponding to the converted output voltage level A*V_sub to the reference voltage level V_REF.

In some example embodiments, the voltage adder 132 may be configured to transfer the second digital code to the code-to-voltage converter 134. The code-to-voltage converter 134 may be configured to generate a voltage level V_add corresponding to the second digital code. For example, the code-to-voltage converter 134 may be configured to output a voltage level V_add obtained by adding the reference voltage V_REF of the voltage generator 130 and the output voltage A*V_sub of the voltage subtractor 131. The voltage level V_add may be referred to as a new reference voltage level V_REF_new. The code-to-voltage converter 134 may be configured to input the new reference voltage level V_REF_new to the voltage generator 130. For example, the code-to-voltage converter 134 may be configured to change the reference voltage level V_REF to a new reference voltage V_REF_new based on the difference between the voltage V_node1 of the first node and the voltage V_node2 of the second node.

In some example embodiments, the code-to-voltage converter 134 may be configured to select one of the new reference voltage level V_REF_new and the reference voltage level V_REF. For example, the code-to-voltage converter 134 may be configured to select and output the reference voltage level V_REF when the output voltage A*V_sub of the voltage subtractor 131 is smaller than the threshold voltage. As another example, the code-to-voltage converter 134 may be configured to output a new reference voltage level V_REF_new corresponding to the second digital code when the output voltage A*V_sub of the voltage subtractor 131 is greater than the threshold voltage. For example, the code-to-voltage converter 134 may be configured to change the reference voltage level V_REF into a new reference voltage level V_REF_new when the difference between the voltage V_node1 of the first node and the voltage V_node2 of the second node is significantly large.

In some example embodiments, the voltage generator 130 may be configured to receive any one of a new reference voltage level V_REF_new and a reference voltage V_REF from the code-voltage converter 134. When the voltage generator 130 receives a new reference voltage level V_REF_new, the voltage generator 130 may be configured to generate an output voltage using the new reference voltage level V_REF_new. Accordingly, when the nonvolatile memory device 400 performs any one of program, read, program verify, and erase verify on the nonvolatile memory (not shown) based on the difference between the voltage of the first node V_node1 and the voltage of the second node V_node2, set-up time may be reduced.

Figure 8:
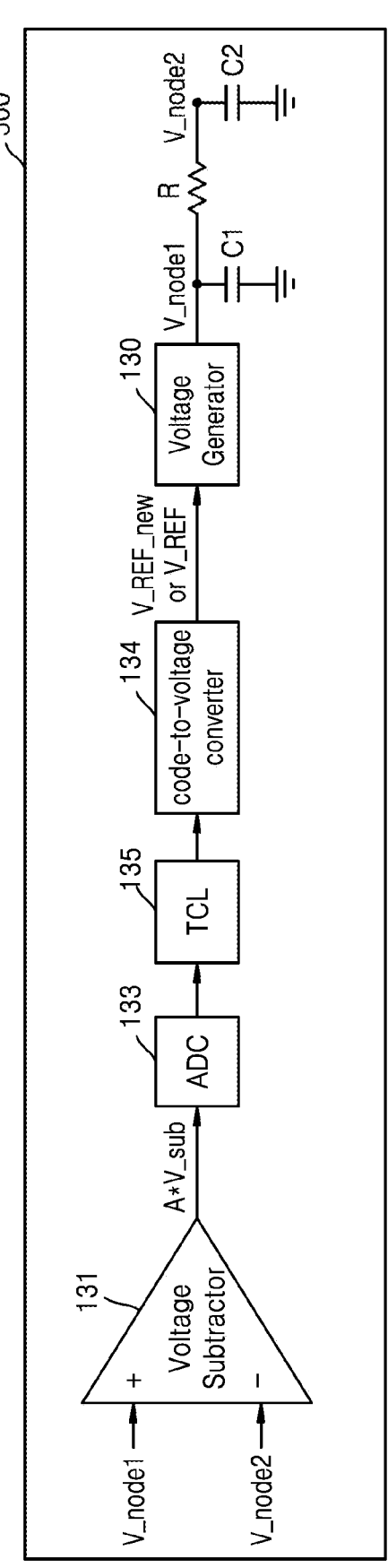
FIG. 8 illustrates some configurations of a nonvolatile memory device according to some example embodiments.

FIG. 8 illustrates some configurations of a nonvolatile memory device according to some example embodiments. FIG. 8 may be described with reference to FIGS. 1, 6, and 7.

Referring to FIG. 8, in some example embodiments, a nonvolatile memory device 500 may include a voltage subtractor 131, an analog to digital converter (ADC) 133, a code-to-voltage converter 134, a time control logic (TCL) 135, and a voltage generator 130. For convenience of description, only the voltage subtractor 131, the voltage adder 132, the ADC 133, the code-to-voltage converter 134, the TCL 135, and the voltage generator 130 are shown in FIG. 7, but the nonvolatile memory device 300 may further include a memory cell array (not shown), a page buffer unit (not shown), a control logic (not shown), and a row decoder (not shown) and is not limited to the above configurations. For example, the nonvolatile memory device 300 may correspond to the nonvolatile memory device 100 of FIG. 1, and duplicate descriptions of FIGS. 1, 6, and 7 may be omitted.

The voltage subtractor 131 may be configured to determine the difference between the voltage V_node1 of the first node and the voltage V_node2 of the second node. The voltage subtractor 131 may be configured to output a voltage level V_sub corresponding to a difference between the voltage V_node1 of the first node and the voltage V_node2 of the second node. For example, the voltage level A*V_sub obtained by multiplying the gain A by the voltage level V_sub corresponding to the difference between the voltage V_node1 of the first node and the voltage V_node2 of the second node may be output. The voltage subtractor 131 may be configured to input the output voltage level A*V_sub to the ADC 133.

The ADC 133 may be configured to convert the voltage level A*V_sub input from the voltage subtractor 131 into a first digital code of the corresponding voltage level. The ADC 133 may be configured to transfer the first digital code to the TCL 135.

The TCL 135 may be configured to receive the reference voltage level V_REF of the voltage generator 130 and the first digital code. The reference voltage level V_REF may be in the form of a digital code. The TCL 135 may be configured to generate a voltage level V_add generated by adding the reference voltage level V_REF and the first digital code and a second digital code indicating the duration of the target voltage level. The voltage level V_add may be referred to as a new reference voltage level V_REF_new. The TCL 135 may be configured to transfer the second digital code to the code-to-voltage converter 134.

In some example embodiments, the code-to-voltage converter 134 may be configured to cause the voltage generator 130 to generate a new reference voltage level V_REF_new indicated by the second digital code for a duration indicated by the second digital code, and the new reference voltage level V_REF_new may be input to the voltage generator 130. For example, the code-voltage converter 134 may be configured to change the reference voltage V_REF to a new reference voltage level V_REF_new based on the difference between the voltage V_node1 of the first node and the voltage V_node2 of the second node.

In some example embodiments, the code-to-voltage converter 134 may be configured to select one of the new reference voltage level V_REF_new and the reference voltage V_REF. For example, the code-to-voltage converter 134 may be configured to select and output the reference voltage V_REF when the output voltage level A*V_sub of the voltage subtractor 131 is smaller than the threshold voltage. In some example embodiments, the code-to-voltage converter 134 may be configured to output a new reference voltage level V_REF_new indicated by the second digital code when the output voltage level A*V_sub of the voltage subtractor 131 is greater than the threshold voltage. For example, the code-to-voltage converter 134 may be configured to change the reference voltage V_REF to a new reference voltage level V_REF_new when the difference between the voltage of the first node V_node1 and the voltage of the second node V_node2 is significantly large.

The voltage generator 130 may be configured to receive any one of a new reference voltage level V_REF_new and a reference voltage V_REF from the code-to-voltage converter 134. When the voltage generator 130 receives a new voltage level V_REF_new, the voltage generator 130 may be configured to generate an output voltage using the new reference voltage level V_REF_new. Accordingly, when the nonvolatile memory device 500 performs any one of program, read, program verify, and erase verify on the nonvolatile memory (not shown) based on the difference between the voltage of the first node V_node1 and the voltage of the second node V_node2, set-up time may be reduced.

FIG. 9 illustrates an operating procedure of a nonvolatile memory device according to some example embodiments. FIG. 9 may be described with reference to FIG. 1.

In operation S901, the nonvolatile memory device 100 may be configured to calculate a difference between the voltage level of the first word line node and the voltage level of the second word line node. The first word line node may be closer to the output terminal of the voltage generator 130 than the second word line node.

For example, the first word line node is the output terminal of the voltage generator 130, and the second word line node may be a node on a word line separated from the output terminal of the voltage generator 130 by a preset, or alternatively desired, distance or more.

In some example embodiments, the first word line node may be a node on a word line separated from the output terminal of the voltage generator 130 by a preset, or alternatively desired, distance or more, and the second word line node may be a node farther from the output terminal of the voltage generator 130 than the first word line node.

In operation S902, the nonvolatile memory device 100 may be configured to change the first reference voltage level of the voltage generator 130 to a second reference voltage level based on the voltage level difference.

For example, the nonvolatile memory device 100 may be configured to generate a reference compensation level based on the voltage level difference. Also, in some example embodiments, the nonvolatile memory device 100 may be configured to generate the second reference voltage level by adding the first reference voltage level and the reference compensation level.

In some example embodiments, the nonvolatile memory device 100 may be configured to generate the reference compensation level based on the voltage level difference and convert the reference compensation level into a first digital code. The nonvolatile memory device 100 may be configured to generate a second digital code by adding the first digital code and the first reference voltage level. The nonvolatile memory device 100 may be configured to determine a voltage level corresponding to the second digital code as the second reference voltage level. The nonvolatile memory device 100 may be configured to determine the duration of the target voltage level based on the first digital code, and may apply the target voltage level for the determined duration.

In operation S903, the nonvolatile memory device 100 may be configured to determine a target voltage level based on any one of the first reference voltage level and the second reference voltage level.

For example, the nonvolatile memory device 100 may be configured to determine the target voltage level based on the second reference voltage level when a difference between the first reference voltage level and the second reference voltage level is greater than or equal to a threshold value.

In some example embodiments, when a difference between the first reference voltage level and the second reference voltage level is less than a threshold value, the nonvolatile memory device 100 may be configured to determine the target voltage level based on the first reference voltage level.

In operation S904, the nonvolatile memory device 100 may be configured to perform any one of program, read, program verify, and erase verify on a nonvolatile memory (not shown) based on the target voltage level.

Figure 10:
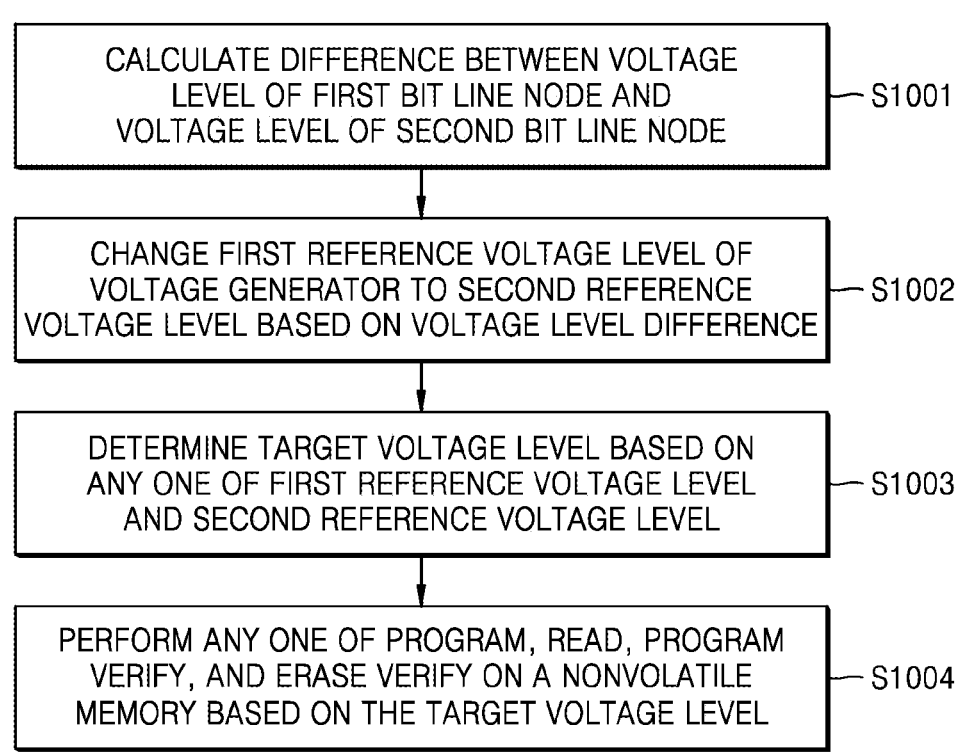
FIG. 10 illustrates an operating procedure of a nonvolatile memory device according to some example embodiments.

FIG. 10 illustrates an operating procedure of a nonvolatile memory device according to some example embodiments. FIG. 10 may be described with reference to FIG. 1.

In operation S1001, the nonvolatile memory device 100 may be configured to calculate a difference between a voltage level of a first bit line node and a voltage level of a second bit line node. A first bit line node may be closer to the output terminal of the voltage generator 130 than a second bit line node.

In some example embodiments, the first bit line node is the output terminal of the voltage generator 130, and the second bit line node may be a node on a bit line separated from the output terminal of the voltage generator 130 by a preset, or alternatively desired, distance or more.

In some example embodiments, the first bit line node may be a node on a bit line separated by a preset, or alternatively desired, distance from the output terminal of the voltage generator 130, and the second bit line node may be a node on the bit line further away from the output terminal of voltage generator 130 than the first bit line node.

In operation S1002, the nonvolatile memory device 100 may be configured to change the first reference voltage level of the voltage generator 130 to a second reference voltage level based on the voltage level difference.

In some example embodiments, the nonvolatile memory device 100 may be configured to generate a reference compensation level based on a voltage level difference. Also, in some example embodiments, the nonvolatile memory device 100 may be configured to generate the second reference voltage level by adding the first reference voltage level and the reference compensation level.

In some example embodiments, the nonvolatile memory device 100 may be configured to generate a reference compensation level based on a voltage level difference and convert the reference compensation level into a first digital code. The nonvolatile memory device 100 may be configured to generate a second digital code by adding the first digital code and the reference voltage level. The nonvolatile memory device 100 may be configured to determine a voltage level corresponding to the second digital code as the second reference voltage level. The nonvolatile memory device 100 may be configured to determine the duration of the target voltage level based on the first digital code, and may apply the target voltage level for the determined duration.

In operation S1003, the nonvolatile memory device 100 may be configured to determine a target voltage level based on any one of the first reference voltage level and the second reference voltage level.

In some example embodiments, the nonvolatile memory device 100 may be configured to determine the target voltage level based on the second reference voltage level when a difference between the first reference voltage level and the second reference voltage level is greater than or equal to a threshold value.

In some example embodiments, when a difference between the first reference voltage level and the second reference voltage level is less than a threshold value, the nonvolatile memory device 100 may be configured to determine the target voltage level based on the first reference voltage level.

In operation S1004, the nonvolatile memory device 100 may be configured to perform any one of program, read, program verify, and erase verify on a nonvolatile memory (not shown) based on the target voltage level.

Figure 11A:
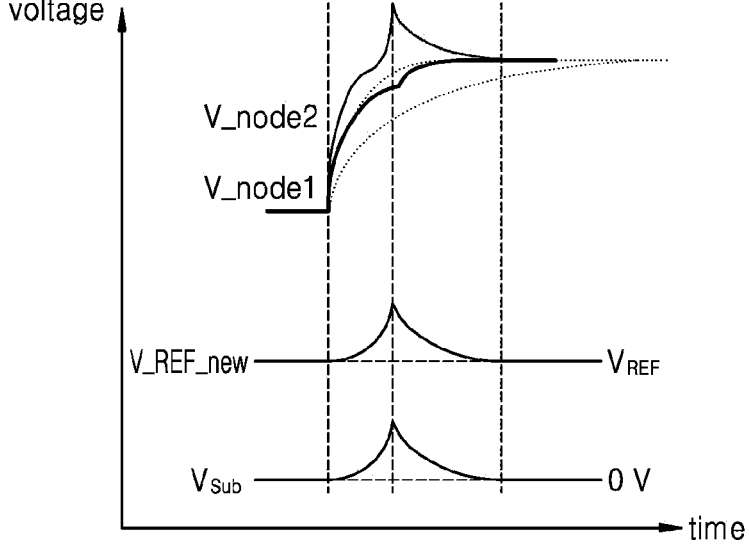
FIG. 11A illustrates an example of voltages in the nonvolatile memory device of FIG. 6 according to some example embodiment.

FIG. 11A illustrates an example of voltages in the nonvolatile memory device of FIG. 6 according to some example embodiments. FIG. 11A may be described with reference to FIGS. 1 and 6.

Referring to the upper part of FIG. 11A, in some example embodiments, as the voltage generator 130 according to some example embodiments continuously controls the output voltage based on the new reference voltage V_REF_new, the shapes of the voltage V_node1 at the first node and the voltage V_node2 at the second node of FIG. 11A may be shown. For example, the upper part of FIG. 11A shows an example of the voltage V_node1 at the first node and the voltage V_node2 at the second node when the voltage generator 130 generates an output voltage based on the difference between the voltage V_node1 at the first node and the voltage V_node2 at the second node according to some example embodiments. The dotted line may indicate an example of a voltage at each node when some example embodiments of the inventive concepts are not applied.

The lower part of FIG. 11A shows that a new reference voltage level V_REF_new is obtained by adding the voltage level V_sub corresponding to the difference between the voltage V_node1 at the first node and the voltage V_node2 at the second node and the reference voltage level V_REF according to some example embodiments.

Figure 11B:
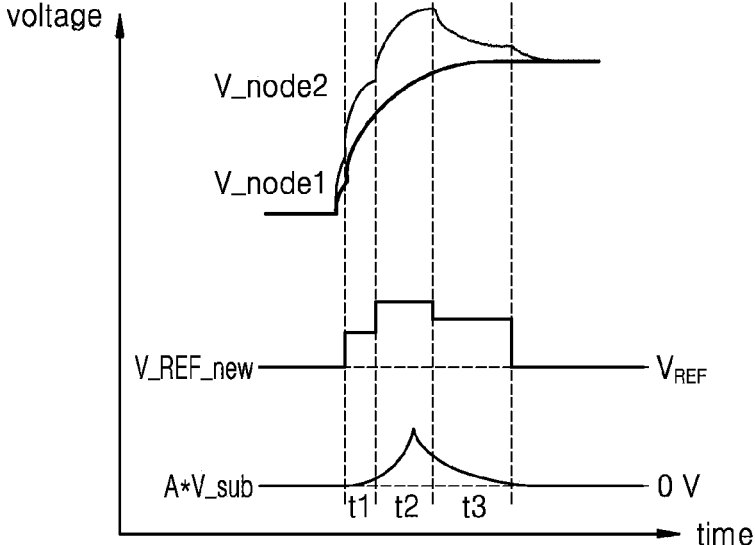
FIG. 11B illustrates an example of voltages in the nonvolatile memory devices of FIGS. 7 and 8 according to some example embodiments.

FIG. 11B illustrates an example of voltages in the nonvolatile memory devices of FIGS. 7 and 8 according to some example embodiments.

The upper part of FIG. 11B shows the voltage at the first node V_node1 and the voltage at the second node V_node2. However, a case in which the nonvolatile memory device 100 performs digital compensation using the ADC 133 is shown according to some example embodiments.

As the voltage generator 130 according to some example embodiments continuously controls the output voltage based on the new reference voltage V_REF_new, the shapes of the voltage V_node1 at the first node and the voltage V_node2 at the second node of FIG. 11B may be shown. For example, the upper portion of FIG. 11B shows an example of voltages at the first node and the second node when the voltage generator 130 generates an output voltage based on the voltage V_node1 at the first node and the voltage V_node2 at the second node.

The lower part of FIG. 11B shows that a new reference voltage level V_REF_new is obtained by adding the voltage level V_sub corresponding to the difference between the voltage V_node1 at the first node and the voltage V_node2 at the second node and the reference voltage level V_REF according to some example embodiments. In the case of digital compensation, the TCL 135 may set durations t1, t2, and t3 of the new reference voltage level V_REF_new according to some example embodiments.

Figure 12:
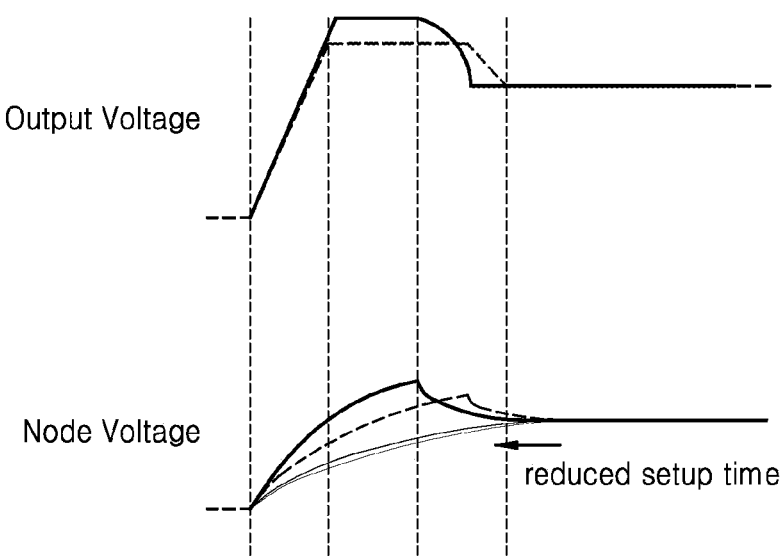
FIG. 12 illustrates an example of an output voltage and a node voltage of a voltage generator of a nonvolatile memory device according to some example embodiments.

FIG. 12 illustrates an example of an output voltage and a node voltage of a voltage generator of a nonvolatile memory device according to some example embodiments. FIG. 12 may be described with reference to FIG. 1.

Referring to the upper part of FIG. 12, the output voltage of the voltage generator 130 may be continuously controlled according to the difference between the voltage V_node1 at the first node and the voltage V_node2 at the second node. Compared to the case (dotted line) where the output voltage of the voltage generator 130 does not consider the difference between the voltage V_node1 at the first node and the voltage V_node2 at the second node, a section in which the output voltage does not change may appear first.

According to some example embodiments, as shown in FIG. 12, the output voltage of the voltage generator 130 may continuously change.

Referring to the lower portion of FIG. 12, as the output of the voltage generator 130 continuously changes, the voltage at the first node V_node1 and the voltage at the second node V_node2 may be set up early.

Figure 13:
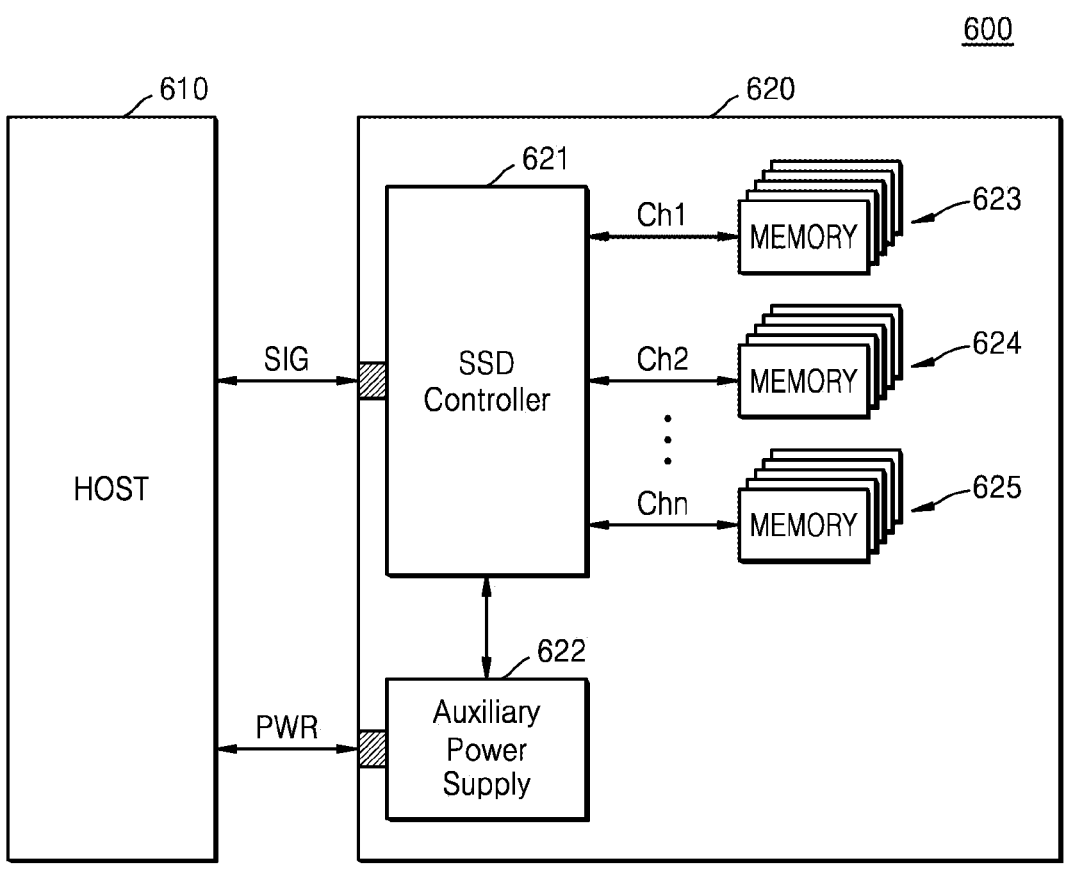
FIG. 13 is a block diagram illustrating an example of applying a memory device according to some example embodiments to a solid-state drive (SSD) system.

FIG. 13 is a block diagram illustrating an example in which a memory device according to some example embodiments is applied to a solid-state drive (SSD) system. FIG. 13 may be described with reference to FIGS. 1, 4, 5, and 6.

Referring to FIG. 13, according to some example embodiments, an SSD system 600 may include a host 610 and an SSD 620. The SSD 620 exchanges signals with the host 610 through a signal connector SIG, and receives power through a power connector PWR. The SSD 620 may include an SSD controller 621, an auxiliary power supply 622, and memory devices 623, 624, and 625, but example embodiments are not limited thereto. The memory devices 623, 624, and 625 may be vertically stacked NAND flash memory devices according to some example embodiments. In some example embodiments, the SSD 620 may be implemented using the example embodiments described above with reference to FIGS. 1 to 9. For example, the memory devices 623, 624, and 625 may be implemented using some example embodiments described above with reference to FIGS. 1 to 9.

The SSD system 600 according to some example embodiments may include a switch (not shown), a voltage subtractor 131 and a voltage adder 132 as illustrated in, for example, FIGS. 6 and 7. In some example embodiments, each of the memory devices 623, 624, and 625 may include a switch (not shown), a voltage subtractor 131, and a voltage adder 132. Each of the memory devices 623, 624, and 625 may correspond to the nonvolatile memory device of FIG. 1. Each of the memory devices 623, 624, and 625 may include a memory cell array 110 including a memory cell and a select word line connected to the memory cell. Each of the memory devices 623, 624, and 625 may further include a control logic 120 and a voltage generator 130.

According to some example embodiments, the control logic 120 may be configured to control the voltage subtractor 131 to calculate a difference between the voltage level of the first word line node and the voltage level of the second word line node, control the voltage adder 132 to change a first reference voltage level to a second reference voltage level based on the voltage level difference, and control the switch to determine a target voltage level based on any one of the first reference voltage level and the second reference voltage level.

According to some example embodiments, the voltage generator 130 may be configured to generate the target voltage level. The first word line node and the second word line node are nodes on the selected word line, and the first word line node may be closer from the output terminal of the voltage generator than the second word line node.

The control logic 120 according to some example embodiments may be controlled to perform any one of program, read, program verify, and erase verify on the memory cell array 110 based on the target voltage level.

The control logic 120 according to some example embodiments may be configured to control the voltage subtractor 131 to generate a reference compensation level based on the voltage level difference, and control the voltage adder 132 to generate the second reference voltage level by adding the first reference voltage level and the reference compensation level.

Each of the memory devices 623, 624, and 625 according to some example embodiments may further include a code-to-voltage converter 134. The control logic 120 may be configured to control the voltage subtractor 131 to generate a reference compensation level based on the difference between the voltage levels, control the ADC 133 to convert the reference compensation level into a first digital code, control the voltage adder 132 to generate a second digital code by adding the first digital code and the reference voltage level, and control the code-to-voltage converter 134 to determine a voltage level corresponding to the second digital code as the second reference voltage level.

According to some example embodiments, when the difference between the first reference voltage level and the second reference voltage level is greater than or equal to the threshold value, the control logic 120 according to some example embodiments may be configured to control the switch (not shown) to determine a target voltage level based on the second reference voltage level.

According to some example embodiments, when the difference between the first reference voltage level and the second reference voltage level is less than the threshold value, the control logic 120 according to some example embodiments may be configured to control the switch (not shown) to determine a target voltage level based on the first reference voltage level.

Figure 14:
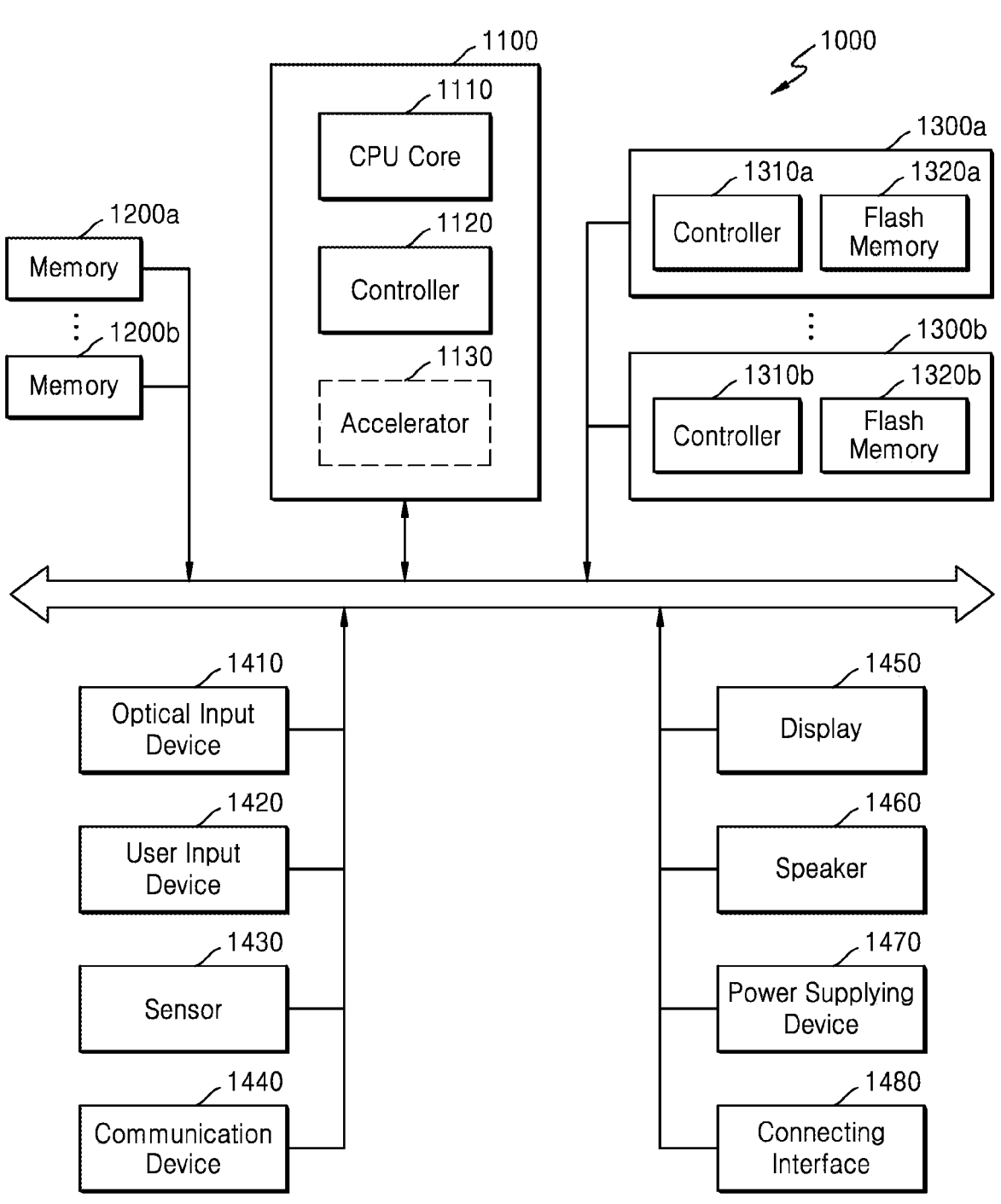
FIG. 14 is a diagram illustrating a system to which a storage device according to some example embodiment is applied.

FIG. 14 is a diagram illustrating a system to which a storage device according to some example embodiments is applied.

A system 1000 of FIG. 14 may be basically a mobile system, such as a mobile phone, a smart phone, a tablet personal computer, a wearable device, a healthcare device, or an Internet of things (IOT) device, but example embodiments are not limited thereto. However, the system 1000 is not necessarily limited to a mobile system, and may be, for example, a personal computer, a laptop computer, a server, a media player, or an automotive device, such as a navigation device.

Referring to FIG. 14, according to some example embodiments, the system 1000 may include at least one of a main processor 1100, memories 1200*a* and 1200*b*, and storage devices 1300*a* and 1300*b*, and may further include one or more of an image capturing device and/or an optical input device 1410, user input device 1420, a sensor 1430, a communication device 1440, a display 1450, a speaker 1460, a power supplying device 1470 and a connecting interface 1480, but example embodiments are not limited thereto.

In some example embodiments, the main processor 1100 may be configure to control the overall operation of the system 1000, and more particularly, the operation of other components constituting the system 1000. The main processor 1100 may be implemented as a general-purpose processor, a dedicated processor, or an application processor.

The main processor 1100 may include one or more CPU cores 1110 and may further include a controller 1120 for controlling the memories 1200*a* and 1200*b* and/or the storage devices 1300*a* and 1300*b*. According to some example embodiments, the main processor 1100 may further include an accelerator 1130 that is a dedicated circuit for high-speed data operation, such as artificial intelligence (AI) data operation. In some example embodiments the accelerator 1130 may include a graphics processing unit (GPU), a neural processing unit (NPU), and/or a data processing unit (DPU), and the like, and may be implemented as a separate chip physically independent from other components of the main processor 1100.

In some example embodiments, the memories 1200*a* and 1200*b* may be used as the main memory device of the system 1000 and may include volatile memories, such as SRAM and/or DRAM, but include nonvolatile memories, such as flash memory, PRAM and/or RRAM. The memories 1200*a* and 1200*b* may be implemented in the same package as the main processor 1100.

In some example embodiments, the storage devices 1300*a* and 1300*b* may function as nonvolatile storage devices that store data regardless of whether power is supplied or not, and may have a relatively large storage capacity compared to the memories 1200*a* and 1200*b*. The storage devices 1300*a* and 1300*b* include storage controllers 1310*a* and 1310*b* and flash memories 1320*a* and 1320*b* for storing data under the control of the storage controllers 1310*a* and 1310*b*. The flash memories 1320*a* and 1320*b* may include a V-NAND flash memory having a 2-dimensional (2D) structure or a 3-dimensional (3D) structure, but may include other types of non-volatile memory, such as PRAM and/or RRAM.

In some example embodiments, the flash memories 1320*a* and 1320*b* may be implemented using the example embodiments described above with reference to FIGS. 1 to 9.

According to some example embodiments, the storage devices 1300*a* and 1300*b* may be included in the system 1000 in a state physically separated from the main processor 1100, or may be implemented in the same package as the main processor 1100. In addition, in some example embodiments, the storage devices 1300*a* and 1300*b* have the same shape as a memory card, and thus, may be detachably coupled with other components of the system 1000 through an interface, such as the connecting interface 1480 to be described later, but example embodiments are not limited thereto. Such storage devices 1300*a* and 1300*b* may be devices to which a standard protocol, such as universal flash storage (UFS) is applied, but example embodiments are not necessarily limited thereto.

In some example embodiments, the optical input device 1410 may capture a still image or a moving image, and may be a camera, a camcorder, and/or a webcam, but example embodiments are not limited thereto.

In some example embodiments, the user input device 1420 may receive various types of data input from a user of the system 1000, and may be a touch pad, a keypad, a keyboard, a mouse, and/or a microphone, but example embodiments are not limited thereto.

In some example embodiments, the sensor 1430 may detect various types of physical quantities that may be obtained from the outside of the system 1000, and may convert the sensed physical quantities into electrical signals. Such a sensor 1430 may be a temperature sensor, a pressure sensor, an illuminance sensor, a position sensor, an acceleration sensor, a biosensor and/or a gyroscope sensor, but example embodiments are not limited thereto.

In some example embodiments, the communication device 1440 may transmit and receive signals between other devices outside the system 1000 according to various communication protocols. Such a communication device 1440 may be implemented including an antenna, a transceiver, and/or a modem, but example embodiments are not limited thereto.

In some example embodiments, the display 1450 and the speaker 1460 may function as output devices that respectively output visual information and audio information to the user of the system 1000, but example embodiments are not limited thereto.

In some example embodiments, the power supplying device 1470 may appropriately convert power supplied from a battery (not shown) built into the system 1000 and/or an external power source and supply the converted power to each component of the system 1000, but example embodiments are not limited thereto.

In some example embodiments, the connecting interface 1480 may provide a connection between the system 1000 and an external device connected to the system 1000 to exchange data with the system 1000. The connecting interface 1480 may be implemented in various interface methods, such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), and compact flash (CF) card interfaces, but example embodiments are not limited thereto.

One or more of the elements disclosed above may include or be implemented in one or more processing circuitries such as hardware including logic circuits; a hardware/software combination such as a processor executing software; or a combination thereof. For example, the processing circuitries more specifically may include, but are not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As described herein, any devices, electronic devices, modules, models, units, and/or portions thereof according to any of the example embodiments, and/or any portions thereof may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), a programmable logic unit, a microprocessor, application-specific integrated circuit (ASIC), a neural network processing UNIT (NPU), an Electronic Control Unit (ECU), and the like. In some example embodiments, the processing circuitry may include a non-transitory computer readable storage device (e.g., a memory), for example a solid state drive (SSD), storing a program of instructions, and a processor (e.g., CPU) configured to execute the program instructions to implement the functionality and/or methods performed by some or all of any devices, electronic devices, modules, units, and/or portions thereof according to any of the example embodiments.

Any of the machine learning models or elements described herein, may, for example, use various artificial neural network organizations and processing models, the artificial neural network organizations including, for example, a convolutional neural network (CNN), a deconvolutional neural network, a recurrent neural network optionally including a long short-term memory (LSTM) and/or a gated recurrent unit (GRU), a stacked neural network (SNN), a state-space dynamic neural network (SSDNN), a deep belief network (DBN), a generative adversarial network (GAN), and/or a restricted Boltzmann machine (RB), and/or the like; and/or include linear and/or logistic regression, statistical clustering. Bayesian classification, decision trees, and/or the like.

Any of the memories described herein may be a non-volatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM)

While the inventive concepts have been shown and described with reference to some example embodiments thereof, it will be understood that various changes in form and details may be made therein without departing from the spirit and scope of the following claims.

22

What is claimed is:

1. A method of operating a nonvolatile memory device including a voltage generator, the method comprising:
calculating a difference between a first voltage level of a first word line node and a second voltage level of a second word line node;
changing a first reference voltage level of the voltage generator to a second reference voltage level based on the difference between the first voltage level of the first word line node and the second voltage level of the second word line node; and
determining a target voltage level based on any one of the first reference voltage level and the second reference voltage level,
wherein the first word line node is closer from an output terminal of the voltage generator than the second word line node.

2. The method of claim 1, further comprising performing any one of program, read, program verify, and erase verify on a nonvolatile memory of the nonvolatile memory device based on the target voltage level.

3. The method of claim 1, wherein the changing of the first reference voltage level to the second reference voltage level comprises:
generating a reference compensation level based on the difference between the first voltage level of the first word line node and the second voltage level of the second word line node; and
generating the second reference voltage level by adding the first reference voltage level and the reference compensation level.

4. The method of claim 1, wherein the changing of the first reference voltage level to the second reference voltage level comprises:
generating a reference compensation level based on the difference between the first voltage level of the first word line node and the second voltage level of the second word line node;
converting the reference compensation level into a first digital code;
generating a second digital code by adding the first digital code and the first reference voltage level; and
determining a third voltage level corresponding to the second digital code as the second reference voltage level.

5. The method of claim 4, further comprising:
determining a duration of the target voltage level based on the first digital code; and
applying the target voltage level for the duration.

6. The method of claim 1, wherein the determining of the target voltage level based on any one of the first reference voltage level and the second reference voltage level comprises determining the target voltage level based on the second reference voltage level when a difference between the first reference voltage level and the second reference voltage level is greater than or equal to a threshold value.

7. The method of claim 1, wherein the determining of the target voltage level based on any one of the first reference voltage level and the second reference voltage level comprises determining the target voltage level based on the first reference voltage level when a difference between the first reference voltage level and the second reference voltage level is less than a threshold value.

8. The method of claim 1, wherein the first word line node is the output terminal of the voltage generator, and the second word line node is a node on a word line separated from the output terminal of the voltage generator by a preset distance or more.

9. The method of claim 1, wherein the first word line node is a node on a word line separated by a preset distance or more from the output terminal of the voltage generator, and the second word line node is further away from the output terminal of the voltage generator than the first word line node.

10. A method of operating a nonvolatile memory device including a voltage generator, the method comprising:

calculating a difference between a first voltage level of a first bit line node and a second voltage level of a second bit line node;

changing a first reference voltage level of the voltage generator to a second reference voltage level based on the difference between the first voltage level of the first bit line node and the second voltage level of the second bit line node; and determining a target voltage level based on any one of the first reference voltage level and the second reference voltage level, wherein the first bit line node is closer from an output terminal of the voltage generator than the second bit line node.

11. The method of claim 10, further comprising performing any one of program, read, program verify, and erase verify on a nonvolatile memory of the nonvolatile memory device based on the target voltage level.

12. The method of claim 10, wherein the changing of the first reference voltage level to the second reference voltage level comprises:

generating a reference compensation level based on the difference between the first voltage level of the first bit line node and the second voltage level of the second bit line node; and generating the second reference voltage level by adding the first reference voltage level and the reference compensation level.

13. The method of claim 10, wherein the changing of the first reference voltage level to the second reference voltage level comprises:

generating a reference compensation level based on the difference between the first voltage level of the first bit line node and the second voltage level of the second bit line node;

converting the reference compensation level into a first digital code;

generating a second digital code by adding the first digital code and the first reference voltage level; and determining a third voltage level corresponding to the second digital code as the second reference voltage level.

14. The method of claim 13, further comprising:

determining a duration of the target voltage level based on the first digital code; and applying the target voltage level for the duration.

15. A nonvolatile memory device including a switch, a voltage subtractor, and a voltage adder, the nonvolatile memory device comprising:

a memory cell array including memory cells and select word lines coupled to the memory cells;

24 a control logic configured to control the voltage subtractor to calculate a difference between a first voltage level of a first word line node and a second voltage level of a second word line node, control the voltage adder to change a first reference voltage level to a second reference voltage level based on the difference between the first voltage level of the first word line node and the second voltage level of the second word line node, and control the switch to determine a target voltage level based on any one of the first reference voltage level and the second reference voltage level; and a voltage generator configured to generate the target voltage level, wherein the first word line node and the second word line node are nodes on a selected word line, and the first word line node is closer from an output terminal of the voltage generator than the second word line node.

16. The nonvolatile memory device of claim 15, wherein the control logic is further configured to control performing any one of program, read, program verify, and erase verify on the memory cell array based on the target voltage level.

17. The nonvolatile memory device of claim 15, wherein that the control logic is configured to control the voltage adder to change the first reference voltage level to the second reference voltage level includes that the control logic is configured to control the voltage subtractor to generate a reference compensation level based on the difference between the first voltage level of the first word line node and the second voltage level of the second word line node and control the voltage adder to generate the second reference voltage level by adding the first reference voltage level and the reference compensation level.

18. The nonvolatile memory device of claim 15, further comprising a code converter, wherein that the control logic is configured to control the voltage adder to change the first reference voltage level to the second reference voltage level includes that the control logic is configured to control the voltage subtractor to generate a reference compensation level based on the difference between the first voltage level and the second voltage level, control an analog to digital converter (ADC) to convert the reference compensation level into a first digital code, control the voltage adder to generate a second digital code by adding the first digital code and the first reference voltage level, and control the code converter to determine a third voltage level corresponding to the second digital code as the second reference voltage level.

19. The nonvolatile memory device of claim 15, wherein that the control logic is configured to determine the target voltage level based on any one of the first reference voltage level and the second reference voltage level is that, when a difference between the first reference voltage level and the second reference voltage level is greater than or equal to a threshold value, the control logic is configured to control the switch to determine the target voltage level based on the second reference voltage level.

20. The nonvolatile memory device of claim 15, wherein that the control logic is configured to determine the target voltage level based on any one of the first reference voltage level and the second reference voltage level is that, when a difference between the first reference voltage level and the second reference voltage level is less than a threshold value, the control logic is configured to control the switch to determine the target voltage level based on the first reference voltage level.

* * * * *